United States Patent
Sturtevant et al.

(10) Patent No.: US 7,349,752 B1
(45) Date of Patent: Mar. 25, 2008

(54) DYNAMICALLY COUPLED METROLOGY AND LITHOGRAPHY

(75) Inventors: John L. Sturtevant, Beaverton, OR (US); Yiming Gu, Hillsboro, OR (US)

(73) Assignee: Integrated Device Technology, inc., San Jose, CA (US)

( * ) Notice: Subject to any disclaimer, the term of this patent is extended or adjusted under 35 U.S.C. 154(b) by 751 days.

(21) Appl. No.: 10/773,665

(22) Filed: Feb. 6, 2004

(51) Int. Cl.
*G06F 19/00* (2006.01)

(52) U.S. Cl. ............. 700/105; 700/121; 438/14; 716/4

(58) Field of Classification Search ........... 700/105, 700/121; 438/14; 324/537; 716/4, 19; 430/30, 430/311
See application file for complete search history.

(56) References Cited

U.S. PATENT DOCUMENTS

| | | | |
|---|---|---|---|
| 5,701,013 A | 12/1997 | Hsia et al. |
| 5,952,132 A | 9/1999 | King et al. |
| 6,127,075 A | 10/2000 | Hsu |
| 6,440,759 B1 | 8/2002 | Commons et al. |
| 2003/0033046 A1 | 2/2003 | Yoshitake et al. |
| 2003/0087192 A1 | 5/2003 | Gau et al. |
| 2003/0115558 A1 | 6/2003 | Conrad et al. |

*Primary Examiner*—Leo Picard
*Assistant Examiner*—Sheela Rao
(74) *Attorney, Agent, or Firm*—Kenneth Glass; Glass & Associates

(57) ABSTRACT

Methods for determining tolerances are disclosed that can be used for determining whether a lot of semiconductor wafers needs to be reworked. Overlay tolerance, critical dimension tolerance and a dynamic line edge placement tolerance are determined using error measurements that are taken from sample wafers in the lot, giving tolerances that reflect the error state of that particular lot of semiconductor wafers.

32 Claims, 9 Drawing Sheets

DYNAMICALLY COUPLED METROLOGY AND LITHOGRAPHY

FIELD OF THE INVENTION

The present invention relates to the field of semiconductor devices. More specifically, the present invention relates to methods for determining whether lots of semiconductor devices should be reworked.

BACKGROUND ART

The push for decreased die sizes and higher performance devices steadily lowers target minimum feature sizes and dictates steadily decreasing error tolerances. Accordingly, critical dimension and overlay error control limits in lithography will continue to decrease, presenting a challenging obstacle for semiconductor manufacturing.

Critical dimension error specifications and overlay error specifications are established for a technology based upon layout design rules, device performance and reliability requirements. Line edge placement specifications, which include both critical dimension error and overlay error, are also established based upon layout design rules, device performance and reliability requirements.

In the fabrication processes critical dimension error and overlay error are considered independently. More particularly, any lot of semiconductor wafers that does not meet the critical dimension specification is reworked (regardless of the overlay error in that lot). Similarly, any lot of semiconductor wafers that does not meet the overlay specification is reworked (regardless of the critical dimension error in that lot).

In conventional methodologies the overlay specification is determined using a worst-case critical dimension error. However, by allowing for worst-case critical dimension error an overly restrictive overlay specification is obtained. This can result in lots of semiconductor wafers being reworked when the semiconductor wafers in the lot do not exceed the allowable line edge placement specification for the lot. This increases rework rates, expends unnecessary manufacturing resources, extends fabrication time and results in increased manufacturing costs.

Accordingly, there is a need for methods that allow for accurately determining critical dimension specifications and overlay specifications based on the line edge placement specifications established for the manufacturing process. Moreover, there is a need for methods that allow for accurately determining whether or not a particular lot of semiconductor wafers needs to be reworked. The present invention meets the above needs.

DISCLOSURE OF THE INVENTION

The present invention provides methods for determining tolerances for manufacturing semiconductor wafers and for determining whether particular lots of semiconductor wafers need to be reworked. The methods of the present invention are based on the actual error state of the lot of semiconductor wafers, giving a more accurate indication of whether a particular lot of semiconductor wafers needs to be reworked.

Methods for dynamically determining overlay tolerance and for determining whether manufacturing lots of semiconductor wafers need to be reworked are disclosed that use critical dimension error measurements taken from sample wafers in the lot. This gives an overlay tolerance that reflects the critical dimension error state of the lot in question, providing an accurate measure of the overlay tolerance required for that lot to meet the required line edge placement specification.

Methods for dynamically determining critical dimension tolerance and for determining whether manufacturing lots of semiconductor wafers need to be reworked are disclosed that use overlay error measurements taken from sample wafers in the lot. This gives a critical dimension tolerance that reflects the overlay error state of the lot in question, providing an accurate measure of the critical dimension tolerance required for that lot to meet the required line edge placement specification.

In another embodiment of the present invention an estimate of the line edge placement error in the lot of semiconductor wafers (dynamic line edge placement tolerance) is determined using critical dimension error measurements and overlay error measurements that are taken from sample wafers in the lot. As actual measurements of error from wafers in the lot are used in determining dynamic line edge placement tolerance, it accurately reflects the error state of the lot in question. Thus, when dynamic line edge placement tolerance is used to determine whether a particular lot of semiconductors needs to be reworked, a more accurate result is obtained.

The methods of the present invention give tolerances that are greater in many cases than the tolerances determined using prior art methods, lowering rework rates while maintaining product yield. The reduction in rework rates gives reduced manufacturing costs and improves cycle time.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
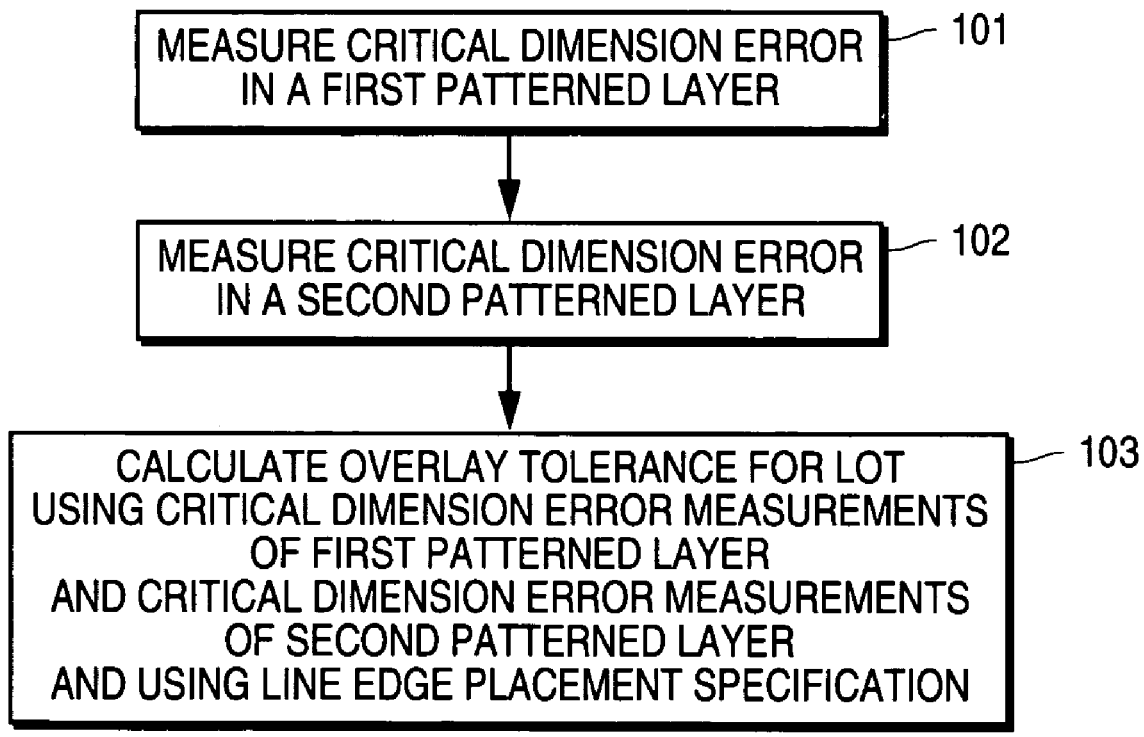
FIG. 1 is a flow chart that illustrates a method for determining overlay tolerance in accordance with one embodiment of the present invention.

FIG. 1 illustrates a method 100 for determining overlay tolerance that utilizes measurements of critical dimension error in the lot of semiconductor wafers for which overlay tolerance is to be determined. As shown by step 101 the critical dimension error of a first patterned layer is measured. In the present embodiment one or more sample wafer from the lot is analyzed using an electron microscope to determine critical dimension error of one or more feature on the first patterned layer. After a second patterned layer has been formed over the semiconductor substrate the critical dimension error of the second patterned layer is measured as shown by step 102.

The overlay tolerance for the lot of semiconductor wafers is then determined as shown by step 103. In the present embodiment overlay tolerance for the lot is determined using the critical dimension error measurements of step 101, the critical dimension error measurements of step 102 and the line edge placement specification.

In one embodiment overlay tolerance (OT) for the lot is determined using the critical dimension error distribution in the first patterned layer ($CDED_A$), the critical dimension error distribution of the second patterned layer ($CDED_B$), the critical dimension error measured in step 101 ($dCD_A$), the critical dimension error measured in step 102 ($dCD_B$), and the line edge placement specification (SPEC) according to the following equation:

$$OT = \sqrt{(SPEC - dCD_A - dCD_B -)^2 - \left(\frac{CDED_A}{2}\right)^2 - \left(\frac{CDED_B}{2}\right)^2} \quad (1)$$

in which the sign convention is set such that positive critical dimension error is in the direction that gives worst-case line edge placement. The line edge placement specification (SPEC) is the specification that has been set (e.g., using design rules) for the two layers in the analysis. In one embodiment the line edge placement specification is a layer-combination-specific specification for the two layers in the analysis.

In one embodiment, $CDED_A$ and $CDED_B$ are estimated using estimates that reflect the anticipated error distribution in the lot of semiconductor wafers. In this embodiment $dCD_A$ can be obtained from a single semiconductor wafer measurement of the first patterned layer (step 101) and $dCD_B$ can be obtained from a single semiconductor wafer measurement of the second patterned layer (step 102). Alternatively, multiple measurements can be made in one or both of steps 101 and 102 and the mean of the measured values can be used for $dCD_A$ and/or for $dCD_B$.

In another embodiment $CDED_A$ and $CDED_B$ are calculated by determining the variance of the measurements taken in steps 101 and 102. More particularly, multiple critical dimension error measurements are taken in step 101. The variance of these critical dimension error measurements is determined and is used in the equation 1 for $CDED_A$. Similarly, multiple critical dimension error measurements are taken in step 102, their variance is determined, and is used in equation 1 for $CDED_B$.

Figure 2:
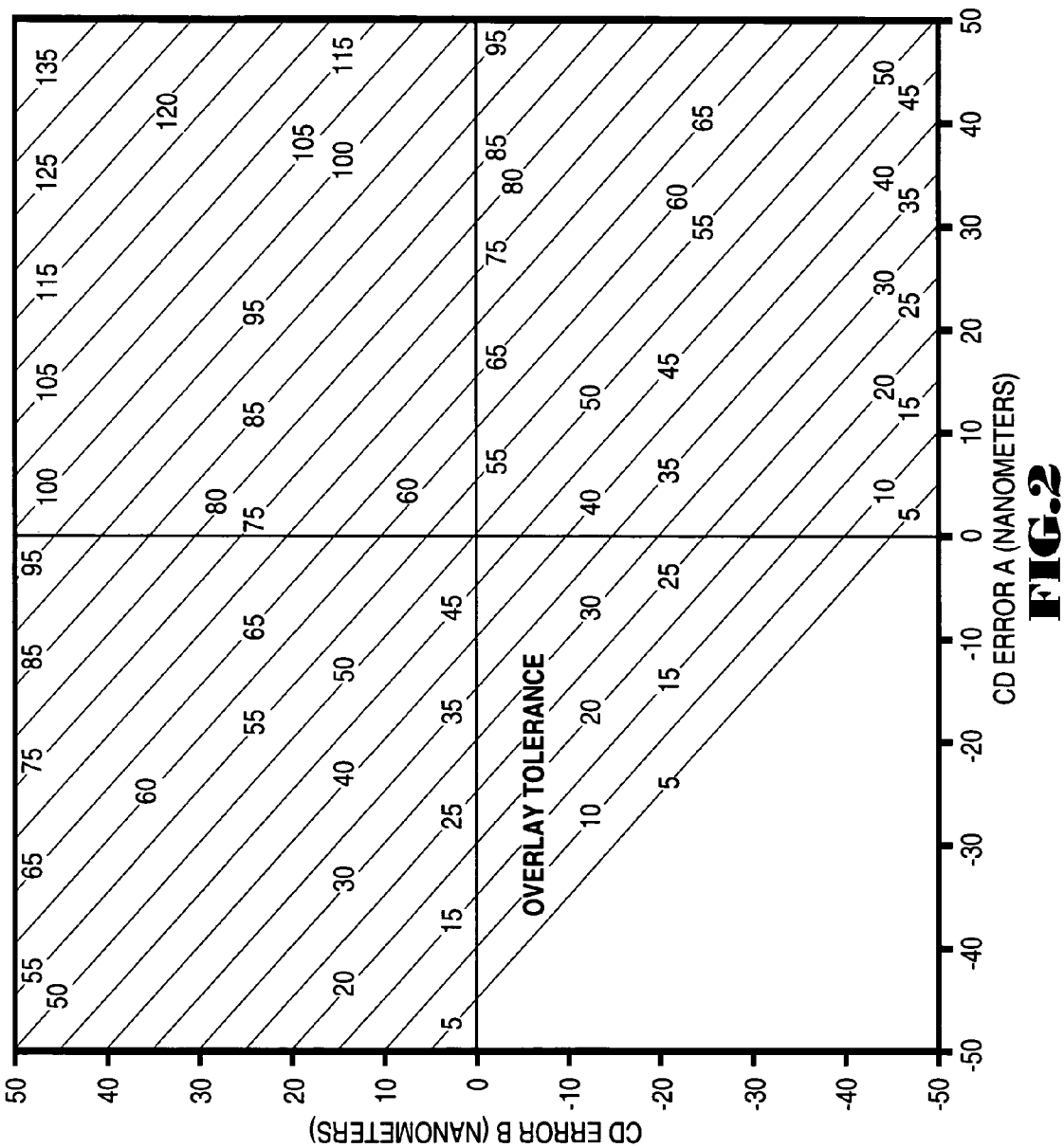
FIG. 2 illustrates a chart that indicates critical dimension error of a first patterned layer (CD Error A) on the horizontal axis (in nanometers), indicates critical dimension error of a second patterned layer (CD Error B) on the vertical axis (in nanometers), and indicates overlay tolerance (in nanometers) between the first pattern layer and the second patterned layer in diagonal lines in accordance with one embodiment of the present invention.

In one embodiment overlay tolerance is calculated mathematically, giving a single numerical value. In another embodiment overlay tolerance is calculated using a chart or other visible indicia. FIG. 2 shows an exemplary chart that can be used for calculating overlay tolerance. In the present example the chart of FIG. 2 reflects the relationship shown in equation 1 for a line edge placement specification (SPEC) of 70 nanometers. However, it is appreciated that other relationships can be used to generate a chart that indicates overlay tolerance as a function of measured critical dimension error and line edge placement specification. For example, a chart could be constructed that reflects overlay error of some relevant sample (e.g., for a similar product, for previous lots, etc.).

Referring to the chart of FIG. 2, overlay tolerance can be determined for a lot of semiconductor wafers by finding the point that corresponds to the measured critical dimension error in the first patterned layer (CD Error A) and the measured critical dimension error in the second patterned layer (CD Error B). The diagonal line that corresponds to this point is the corresponding overlay tolerance. For example, a CD Error A of 0 and a CD error B of 0 give a point that intersects line 50 (which indicates an overlay tolerance of 50 nanometers).

Figure 3:
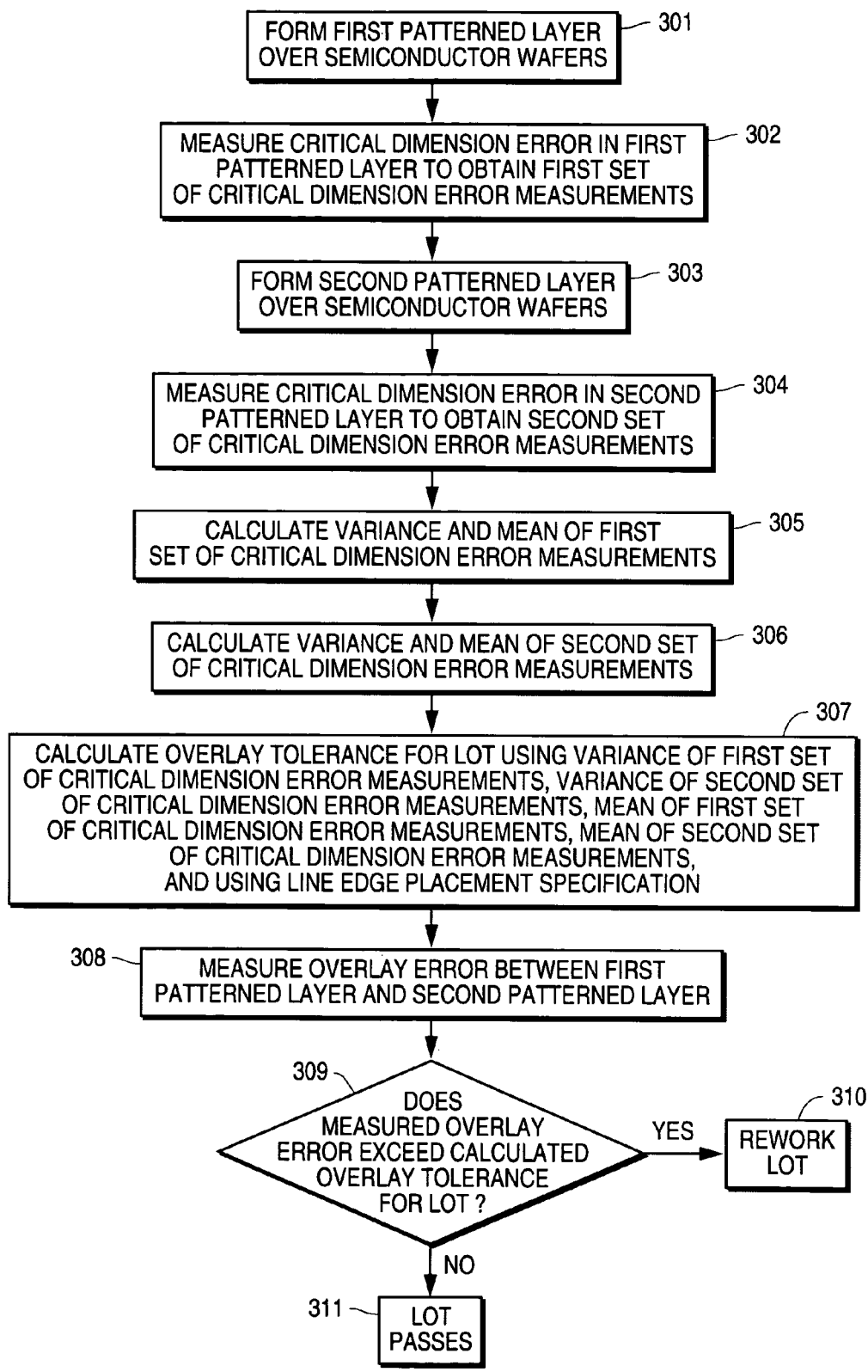
FIG. 3 is a flow chart that illustrates a method for determining whether a lot of semiconductor wafers needs to be reworked in accordance with one embodiment of the present invention.

FIG. 3 illustrates a method 300 for determining whether a lot of semiconductor wafers should be reworked. In this method overlay tolerance is determined for each lot of semiconductor wafers using critical dimension error measurements from semiconductor wafers in the lot. As shown by step 301 a first patterned layer is formed over the semiconductor wafers. More particularly, during the fabrication process each of the wafers in the lot has a first patterned layer formed on the semiconductor wafer. The first patterned layer can be formed, for example, by depositing a first layer of material on each semiconductor wafer and depositing a layer of photoresist over the first layer of material. The layer of photoresist is then patterned by exposing and developing the photoresist layer to form a photoresist masking structure. An etch step is then performed to pattern the first layer. The photoresist masking structure is then removed (e.g., using a photoresist strip process), leaving the completed first patterned layer on the semiconductor substrate.

Referring to step 302, critical dimension error measurements are obtained for the first pattern. In the present embodiment, critical dimension error measurements are obtained by selecting a set of sample wafers that are representative of the lot of semiconductor wafers. Critical dimension error is then measured at a plurality of locations on each of the sample wafers. More particularly, the sizes of specific features (e.g., CD targets) in the first patterned layer are measured to obtain a first set of critical dimension error measurements.

A second patterned layer is formed on the semiconductor wafers as shown by step 303. The second patterned layer can immediately overlie the first patterned layer. Alternatively, one or more intervening layers could extend between the first patterned layer and the second patterned layer. Depending on the particular process, the second pattern can either be a pattern in a layer of photoresist or it can be a pattern in some other material. In one embodiment the second patterned layer is a layer of photoresist and an intervening layer extends between the first patterned layer and the second patterned layer. This structure may be formed by depositing the intervening layer over the first patterned layer and depositing a layer of photoresist over the intervening layer. The layer of photoresist is then patterned by exposing and developing the photoresist layer. This allows for determination of overlay error prior to etching the intervening layer (using the patterned photoresist layer as a mask) and simplifies rework in the event that the lot does not meet the determined overlay tolerance.

Alternatively, the second patterned layer can be a material other than photoresist. This pattern can be formed, for example, by depositing a second layer of material and depositing a layer of photoresist over the second layer of material. The layer of photoresist is then patterned (by exposing and developing the photoresist layer to form a photoresist masking structure) and an etch step is performed to form the second patterned layer. The photoresist masking structure is then removed (e.g., using a photoresist strip process).

Referring to step 304, critical dimension error measurements are obtained for the second patterned layer. In the present embodiment, critical dimension error measurements are obtained by selecting a set of sample wafers that are representative of the lot of semiconductor wafers. Critical dimension error is then measured at a plurality of locations on each of the sample wafers. More particularly, the sizes of specific features in the second pattern are measured to obtain a second set of critical dimension error measurements.

Figure 4B:
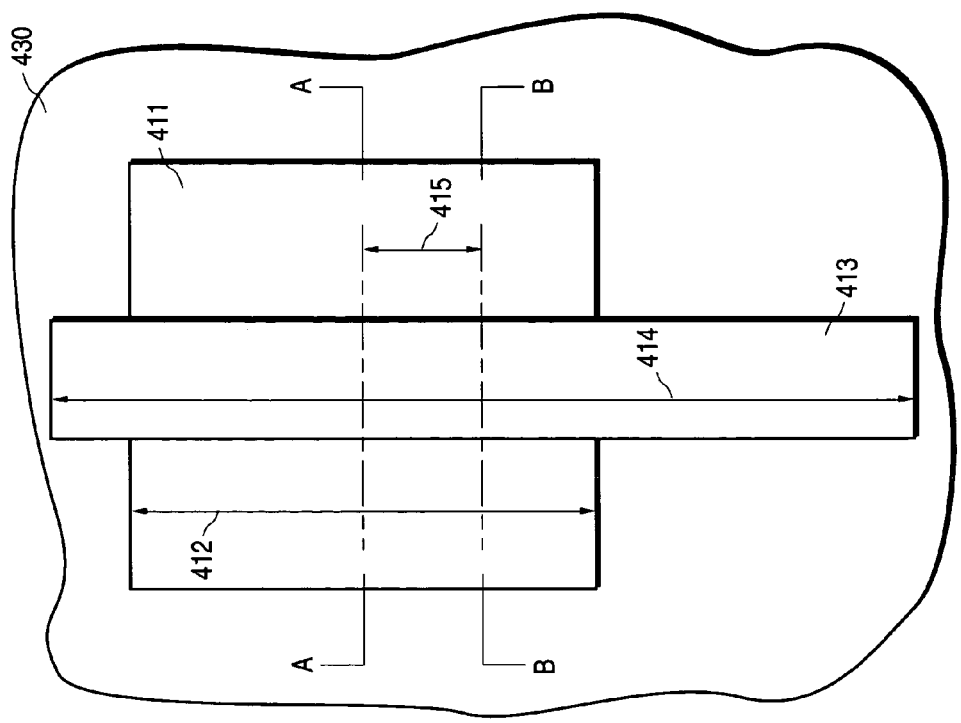
FIG. 4B is a portion of a semiconductor wafer after CD Target A is formed in a first layer and CD Target B is formed in a second layer in accordance with one embodiment of the present invention.
Figure 4A:
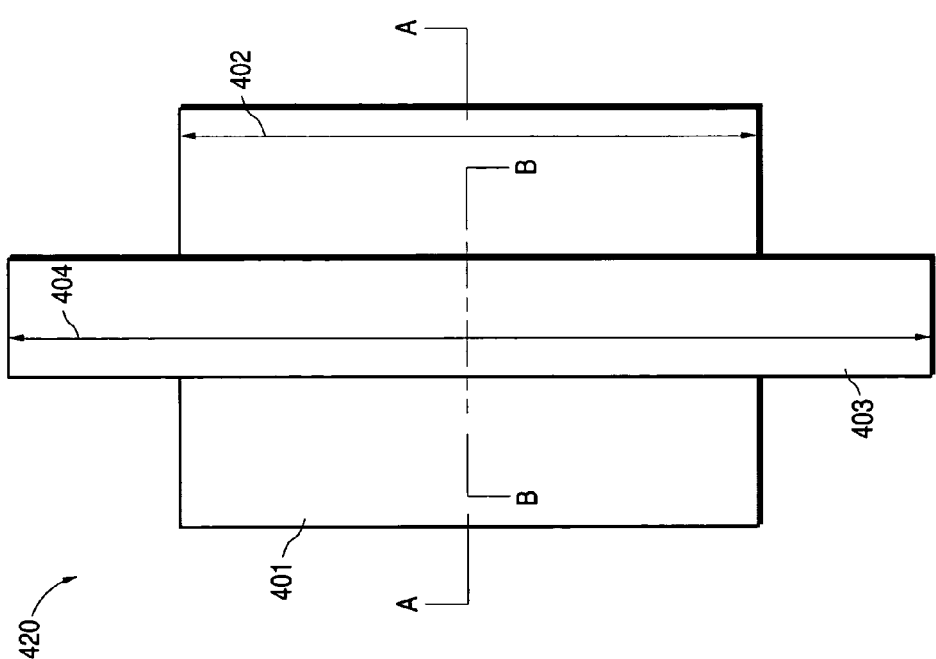
FIG. 4A is a diagram that illustrates a semiconductor design 420 that includes a CD Target A that is to be formed within a first layer and a CD Target B that is to be formed within a second layer in accordance with one embodiment of the present invention.

FIG. 4A shows an exemplary semiconductor design 420 that includes an exemplary feature 401 (CD Target A (design)) that is to be formed within the first patterned layer and a design feature 403 (CD Target B (design)) that is to be formed within a second patterned layer. FIG. 4B shows the implementation of semiconductor design 420 on semiconductor wafer 430. In this example feature 411 (CD Target A (actual)) is shown to be formed in accordance with step 301 and feature 413 (CD Target B (actual) is formed in accordance with step 303. It can be seen that the size of feature 411 which is illustrated by arrow 412 varies from the size of feature 401 (design) which is illustrated by arrow 402. Also, the size of feature 413 (which is illustrated by arrow 414) varies from the size of feature 403 (which is illustrated by arrow 404). Also, the location of feature 411 and feature 413 vary from the design as indicated by the movement of centerlines A-A and B-B.

In the embodiment shown in FIGS. 4A-4B, critical dimension error measurement of feature 411 (step 302) gives a size measurement indicated by arrow 412. The difference between the size of arrow 412 and the intended size of the feature (arrow 402) is the critical dimension error. Similarly, in step 304, critical dimension error measurements are obtained by measuring the size of feature 413 which is indicated by arrow 414. The difference between the size of arrow 414 and the intended size of the feature (arrow 404) is the critical dimension error.

Overlay tolerance is then determined as shown by steps 305-307 using the critical dimension error measurements obtained in steps 302 and 304 and using the line edge placement specification.

Referring now to step 305, variance and mean of the first set of critical dimension error measurements are determined. Mean of the first set of critical dimension error measurements ($dCD_A$) can be determined using the equation:

$$dCD_A = \frac{1}{n}\left(\sum_{i=1}^{n} x_i\right) \quad (2)$$

where $x_1 \ldots x_n$ are the error measurements in the first set of critical dimension error measurements and n is the number of error measurements in the first set of critical dimension error measurements. Variance of the first set of critical dimension error measurements ($VCD_A$) can be determined using the equation:

$$VCD_A = \frac{1}{n-1}\left(\sum_{i=1}^{n} x_i^2 - \frac{1}{n}\left(\sum_{i=1}^{n} x_i\right)^2\right) \quad (3)$$

where $x_1 \ldots x_n$ are the error measurements in the first set of critical dimension error measurements and n is the number of error measurements in the first set of critical dimension error measurements.

Similarly, as shown by step 306, variance and mean of the second set of error measurements is determined. Mean of the second set of critical dimension error measurements ($dCD_B$) can be determined using the equation:

$$dCD_B = \frac{1}{n}\left(\sum_{i=1}^{n} x_i\right) \quad (4)$$

where $x_1 \ldots x_n$ are the error measurements in the second set of critical dimension error measurements and n is the number of error measurements in the second set of critical dimension error measurements. Variance of the second set of critical dimension error measurements ($VCD_B$) can be determined using the equation:

$$VCD_B = \frac{1}{n-1}\left(\sum_{i=1}^{n} x_i^2 - \frac{1}{n}\left(\sum_{i=1}^{n} x_i\right)^2\right) \quad (5)$$

where $x_1 \ldots x_n$ are the error measurements in the second set of critical dimension error measurements and n is the number of error measurements in the second set of critical dimension error measurements.

Referring now to step 307, overlay tolerance (OT) for the lot is then determined using the variance of the first set of critical dimension error measurements ($VCD_A$) the mean of the first set of critical dimension error measurements ($dCD_A$), the variance of the second set of critical dimension error measurements ($VCD_B$), the mean of the second set of critical dimension error measurements ($dCD_B$), and the line edge placement specification (SPEC).

In the present embodiment overlay tolerance is determined according to the following equation:

$$OT = \sqrt{(SPEC - dCD_A - dCD_B -)^2 - \left(\frac{VCD_A}{2}\right)^2 - \left(\frac{VCD_B}{2}\right)^2} \quad (6)$$

in which the sign convention is set such that positive critical dimension error is in the direction that gives worst-case line edge placement. The line edge placement specification (SPEC) is the specification that has been set (e.g., using design rules) for the two layers in the analysis. In one embodiment the line edge placement specification is a layer-combination-specific specification for the two layers in the analysis.

The overlay error is then measured, as shown by step 308, on one or more semiconductor wafer in the lot. In the present embodiment overlay error is measured on each semiconductor wafer in the second set of sample wafers immediately after measurements of critical dimension are taken (step 304). However, it is appreciated that overlay error can be measured using more or fewer wafers and using different sample wafers from those used in critical dimension error measurement step 304.

In FIGS. 4A-4B the overlay error between the first patterned layer and the second patterned layer can be determined by measuring the overlay error between feature 411 in the first patterned layer and feature 413 in the second patterned layer. For example, in the embodiment shown in FIGS. 4A-4B the overlay error is the distance between centerline A-A of feature 411 and the centerline B-B of feature 413 which is indicated by arrow 415.

As shown by steps 309-310 if the measured overlay error exceeds the calculated overlay tolerance for the lot, the entire lot of semiconductor wafers is reworked. If the measured overlay error does not exceed the calculated overlay tolerance for the lot the lot passes as shown by step 311.

In one embodiment a computer is used to determine overlay tolerance and/or to determine whether a lot of semiconductor wafers should be reworked. In one embodiment the computer is operable to perform method 100 and/or method 300 using instructions (e.g., a software program) stored on a computer readable media such as a CD, DVD, floppy disk, etc. In the present embodiment a software program, operable on the computer, receives the first set of critical dimension error measurements (from step 302), receives the second set of critical dimension error measurements (from step 304), receives a line edge placement specification, and is operable to calculate overlay tolerance. In one specific embodiment the computer is operable to determine overlay tolerance using equations 2-6.

As methods 100 and 300 use critical dimension error measurements taken from sample wafers in the lot, an overlay tolerance is obtained that reflects the critical dimension error state of the lot in question. Accordingly the resulting overlay tolerance provides an accurate measure of the maximum allowable overlay tolerance for the lot that will allow the lot to meet the required line edge placement specification.

Figure 5:
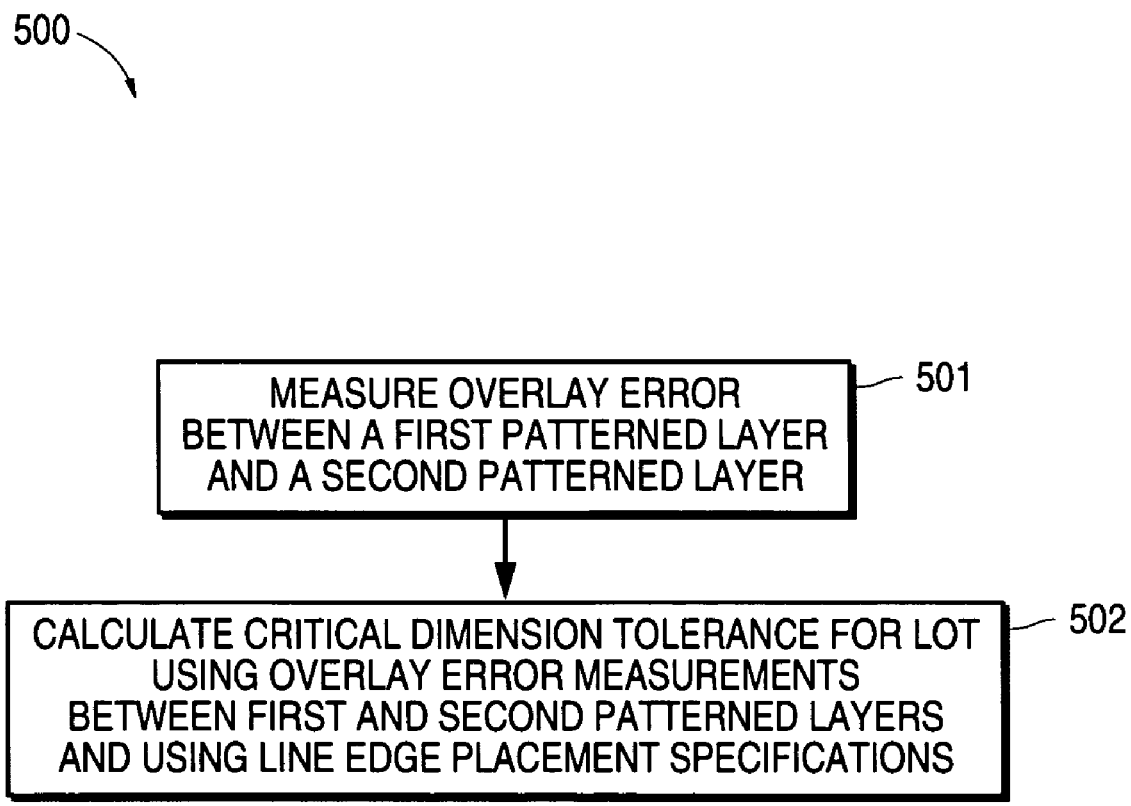
FIG. 5 is a flow chart that illustrates a method for determining critical dimension tolerance in accordance with one embodiment of the present invention.

FIG. 5 illustrates a method 500 for determining critical dimension tolerance that utilizes measurements of overlay error in the lot of semiconductor wafers for which critical dimension tolerance is to be determined. As shown by step 501 the overlay error between a first patterned layer and a second patterned layer is measured. In the present embodiment one or more sample wafers from the lot are analyzed using an electron microscope to determine overlay error between one or more features on the first patterned layer and one or more corresponding feature on the second patterned layer.

The critical dimension tolerance for the lot of semiconductor wafers is then determined as shown by step 502. In the present embodiment critical dimension tolerance for the lot is determined using the overlay error measurements of step 501 and the line edge placement specification.

In one embodiment critical dimension tolerance (CDT) for the lot is determined using the overlay error measured in step 501 ($dO_{B-A}$), the error distribution of the overlay error measurements between the first patterned layer and the second patterned layer ($OED_{B-A}$) and the line edge placement specification (SPEC) according to the following equation:

$$CDT = \sqrt{(SPEC - dO_{B-A})^2 - \left(\frac{OED_{B-A}}{2}\right)^2} \quad (7)$$

in which the sign convention is set such that positive overlay error is in the direction that gives worst-case line edge placement. The line edge placement specification (SPEC) is the specification that has been set (e.g., using design rules) for the layers in the analysis.

In one embodiment, $OED_{B-A}$ is estimated using estimates that reflect the anticipated error distribution in the lot of semiconductor wafers. In this embodiment $dO_{B-A}$ can be obtained from a single semiconductor wafer measurement (step 501). Alternatively, multiple measurements can be made and the mean of the measured values can be used for $dO_{B-A}$.

In another embodiment $OED_{B-A}$ is calculated by determining the variance of the measurements taken in steps 501. More particularly, multiple overlay error measurements are taken in step 501. The variance of these overlay error measurements is determined and is used in equation 7 for $OED_{B-A}$.

In one embodiment critical dimension tolerance is calculated mathematically, giving a single numerical value. In another embodiment critical dimension tolerance is determined using a chart or other visible indicia.

Figure 6:
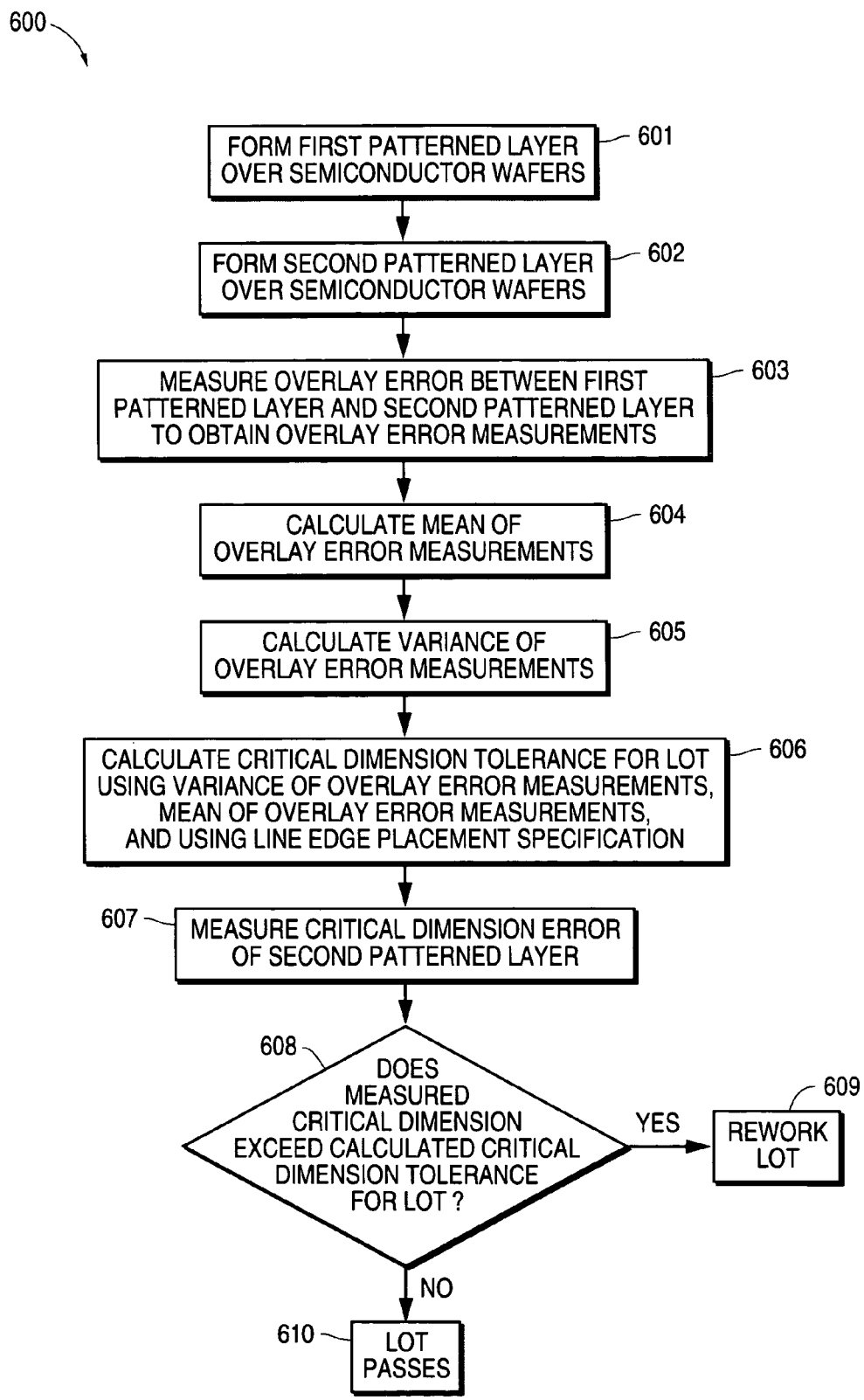
FIG. 6 is a flow chart that illustrates a method for determining whether a lot of semiconductor wafers needs to be reworked in accordance with one embodiment of the present invention.

FIG. 6 illustrates a method 600 for determining whether a lot of semiconductor wafers should be reworked. In this method critical dimension tolerance is determined for each lot of semiconductor wafers using overlay error measurements from semiconductor wafers in the lot. As shown by step 601 a first patterned layer is formed over the semiconductor wafers. More particularly, during the fabrication process each of the wafers in the lot has a patterned layer formed on it.

A second patterned layer is formed on the semiconductor wafers as shown by step 602. The second patterned layer can immediately overlie the first patterned layer. Alternatively, one or more intervening layers could extend between the first patterned layer and the second patterned layer. Depending on the particular process, the second patterned layer can either be a pattern in a layer of photoresist or it can be a pattern in some other material. In one embodiment the second patterned layer is a layer of photoresist and an intervening layer extends between the first patterned layer and the second patterned layer. This structure may be formed by depositing the intervening layer over the first patterned layer and depositing a layer of photoresist over the intervening layer. The layer of photoresist is then patterned by exposing and developing the photoresist layer. This allows for determination of overlay error prior to etching the intervening layer (using the patterned photoresist layer as a mask) and simplifies rework in the event that the lot does not meet the determined critical dimension tolerance.

Alternatively, the second patterned layer can be a material other than photoresist. For example, the second patterned layer can be formed by depositing a second layer of material and depositing a layer of photoresist over the second layer of material. The layer of photoresist is then patterned (by exposing and developing the photoresist layer to form a photoresist masking structure) and an etch step is performed to form the second patterned layer. The photoresist masking structure is then removed (e.g., using a photoresist strip process).

Referring to step 603, overlay error measurements are obtained that indicate the overlay error between the first patterned layer and the second patterned layer. In the present embodiment, overlay error measurements are obtained by selecting a set of sample wafers that are representative of the lot of semiconductor wafers. Overlay error is then measured at one or more locations on each of the sample wafers to obtain a set of overlay error measurements.

Referring now to steps 604-605, variance and mean error of the overlay error measurements are determined. Mean of the overlay error measurements ($dO_{B-A}$) can be determined using the equation:

$$dO_{B-A} = \frac{1}{n}\left(\sum_{i=1}^{n} x_i\right) \quad (8)$$

where $x_1 \ldots x_n$ are the error measurements taken in step 603 and n is the number of error measurements taken. Variance of the overlay error measurements ($VO_{B-A}$) can be determined using the equation:

$$VO_{B-A} = \frac{1}{n-1}\left(\sum_{i=1}^{n} x_i^2 - \frac{1}{n}\left(\sum_{i=1}^{n} x_i\right)^2\right). \quad (9)$$

Referring now to step 606, critical dimension tolerance (CDT) for the lot is then determined using the variance of the overlay error measurements ($VO_{B-A}$) the mean of the overlay error measurements ($dO_{B-A}$) and the line edge placement specification (SPEC).

In the present embodiment critical dimension tolerance (CDT) is determined using the following equation:

$$CDT = \sqrt{(SPEC - dO_{B-A})^2 - \left(\frac{VO_{B-A}}{2}\right)^2} \quad (10)$$

in which the sign convention is set such that positive overlay error is in the direction that gives worst-case line edge placement. The line edge placement specification (SPEC) is the specification that has been set (e.g., using design rules) for the layers in the analysis.

The critical dimension error of the second patterned layer is then measured, as shown by step 607, on one or more semiconductor wafer in the lot. In the present embodiment critical dimension error is measured on each semiconductor wafer in the second set of sample wafers immediately after measurements of overlay error are taken (step 603). However, it is appreciated that critical dimension error can be measured using more or fewer wafers and using different sample wafers from those used in step 603.

As shown by steps 608-609 if the measured critical dimension error exceeds the calculated critical dimension tolerance for the lot, the entire lot of semiconductor wafers is reworked. If the measured critical dimension error does not exceed the calculated critical dimension tolerance for the lot the lot passes as shown by step 610.

In one embodiment a computer is used to determine critical dimension tolerance and/or to determine whether a lot of semiconductor wafers should be reworked. In one embodiment the computer is operable to perform method 500 and/or method 600 using instructions (e.g., a software program) stored on a computer readable media such as a CD, DVD, floppy disk, etc. In the present embodiment a software program, operable on the computer receives a plurality of overlay error measurements (from step 603), receives a line edge placement specification, and is operable to calculate critical dimension tolerance. In one specific embodiment the computer is operable to determine critical dimension tolerance using equations 8-10.

As methods 500 and 600 use overlay error measurements taken from sample wafers in the lot, a critical dimension tolerance is obtained that reflects the overlay error state of the lot in question. Accordingly the resulting critical dimension tolerance provides an accurate measure of the maximum allowable critical dimension tolerance for the lot that will allow the lot to meet the required line edge placement specification.

Figure 7:
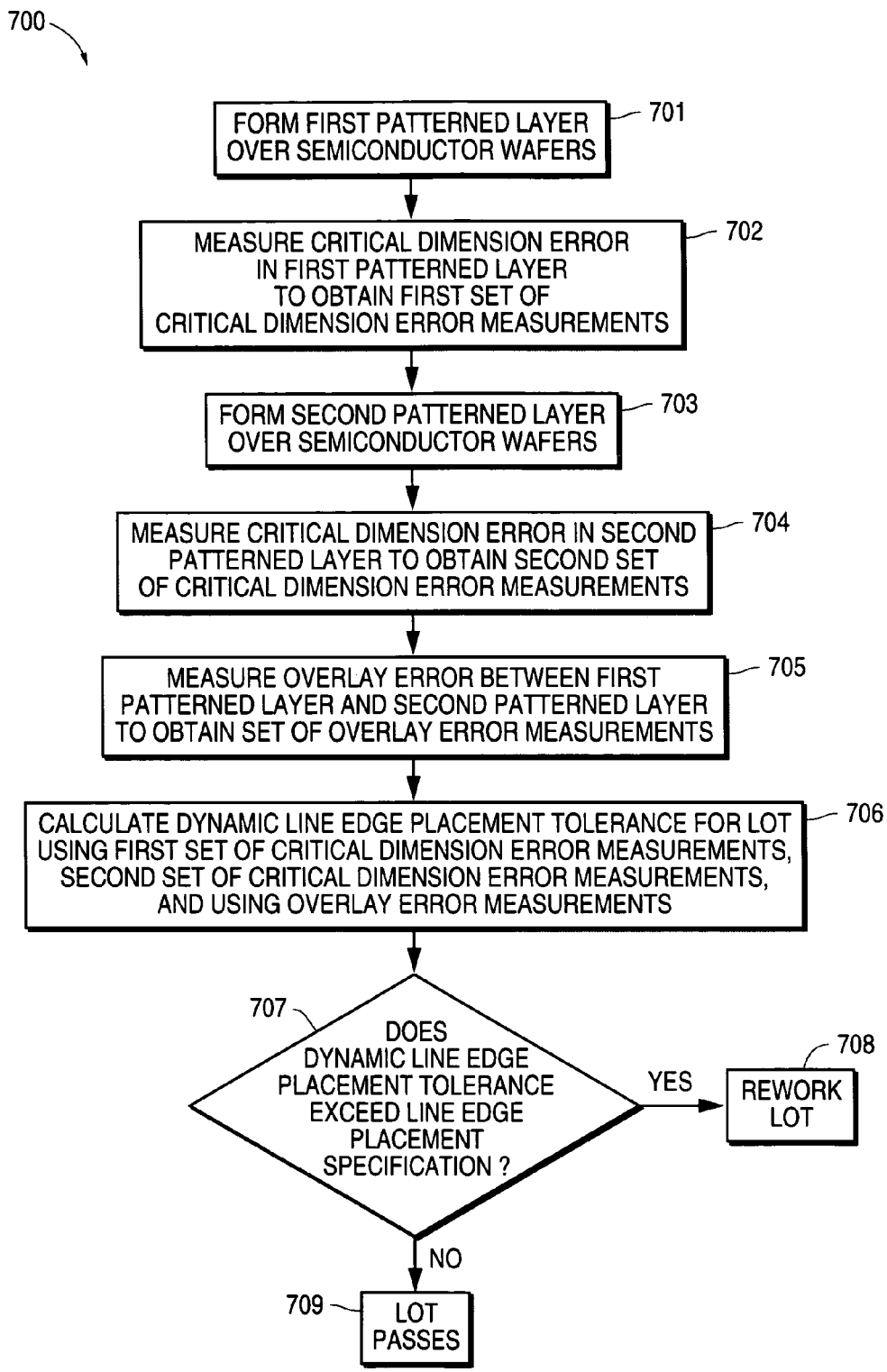
FIG. 7 is a flow chart that illustrates a method 700 for determining whether a lot of semiconductor wafers needs to be reworked in which dynamic line edge placement tolerance is determined in accordance with one embodiment of the present invention.

FIG. 7 illustrates a method 700 for determining whether a lot of semiconductor wafers should be reworked that uses an estimate of the line edge placement error (dynamic line edge placement tolerance) in the a lot of semiconductor wafers. In the present embodiment dynamic line edge placement is calculated using critical dimension error measurements and overlay error measurements from the lot of semiconductor wafers for which dynamic line edge placement tolerance is being determined.

As shown by step 701 a first patterned layer is formed over the semiconductor wafers. Critical dimension error measurements are then taken of the first patterned layer (step 702) so as to obtain a first set of critical dimension error measurements. A second patterned layer is then formed on the semiconductor wafers (step 703) and critical dimension error measurements are taken of the second patterned layer (step 704) so as to obtain a second set of critical dimension error measurements. In the present embodiment steps 701-704 are performed in the same manner as steps 301-304 of FIG. 3.

As shown by step 705 overlay error measurements are taken from one or more of the wafers in the lot so as to give a set of overlay error measurements. In the present embodiment, overlay error measurements are obtained by measuring the same set of sample wafers used in step 704 immediately after measurements of critical dimension are taken. However, it is appreciated that overlay error can be measured using more or fewer wafers and using different sample wafers from those used in critical dimension error measurement step 704.

Dynamic line edge placement tolerance for the lot is then determined as shown by step 706 using the critical dimension error measurements obtained in steps 702 and 704 and using the overlay error measurements of step 705. In the present embodiment Dynamic line edge placement tolerance for the lot is determined using the variance of the first set of critical dimension error measurements ($VCD_A$) the mean error of the first set of critical dimension error measurements ($dCD_A$), the variance of the second set of critical dimension error measurements ($VCD_B$), the mean error of the second set of critical dimension error measurements ($dCD_B$), variance of the overlay error measurements (VO), and mean of the overlay error measurements (dO).

In the present embodiment ($VCD_A$), ($dCD_A$), ($VCD_B$), ($dCD_B$) are determined in the same manner as shown in steps 305 and 306 of FIG. 3. Variance and mean error of the set of overlay error measurements that were taken in step 705 are then determined. Mean of the overlay error measurements (dO) can be determined using the equation:

$$dO = \frac{1}{n}\left(\sum_{i=1}^{n} x_i\right) \quad (11)$$

and variance of the overlay error measurements (VO) can be determined using the equation:

$$VO = \frac{1}{n-1}\left(\sum_{i=1}^{n} x_i^2 - \frac{1}{n}\left(\sum_{i=1}^{n} x_i\right)^2\right) \quad (12)$$

where $x_1 \ldots x_n$ are the overlay error measurements taken in step 705 and n is the number of overlay error measurements taken.

In the present embodiment Dynamic line edge placement tolerance (D) is determined using a mean plus $3\sigma$ metric. In this embodiment the line edge placement mean (LEP mean) can be represented by the equation:

$$LEP\ \text{mean} = dO + \left(\frac{dCD_A}{2}\right) + \left(\frac{dCD_B}{2}\right) \quad (13)$$

and the $3\sigma$ variability for line edge placement (LEP Variability ($3\sigma$)) can be represented by the equation:

$$LEP\ \text{variability}(3\sigma) = \sqrt{\left(\frac{VCD_A}{2}\right)^2 + \left(\frac{VCDe_B}{2}\right)^2 + VO^2} \quad (14)$$

In the present embodiment dynamic line edge placement tolerance is calculated using the elements of equations 13 and 14 to provide an accurate indication of (mean+$3\sigma$) line edge placement error in the lot. In one embodiment dynamic line edge placement tolerance (D) is calculated using the equation:

$$D = dO + \left(\frac{dCD_A}{2}\right) + \left(\frac{dCD_B}{2}\right) + \sqrt{\left(\frac{VCD_A}{2}\right)^2 + \left(\frac{VCD_B}{2}\right)^2 + VO^2} \quad (15)$$

where the sign convention is set such that positive critical dimension error is in the direction that gives the worst case dynamic line edge placement tolerance. This calculation can be performed by first determining the mean and variance of each of the samples taken in steps 702, 704, and 705. Alternatively, dynamic line edge placement tolerance for the lot can be determined using a chart, graph, lookup table or polynomial fit that represents the relationship shown in equation 15.

As shown by step 707 and 709 if the dynamic line edge placement tolerance calculated in step 706 does not exceed the line edge placement specification (mean+$3\sigma$), the lot of semiconductor wafers passes (step 709) and fabrication continues to the next process step. However, if the dynamic line edge placement tolerance calculated in step 706 exceeds the line edge placement specification the lot is reworked (step 708).

In one embodiment a computer is used to determine whether or not the lot of semiconductor wafers should be reworked. In one embodiment the computer is operable to determine whether or not the lot of semiconductor wafers should be reworked using instructions (e.g., a software program) stored on a computer readable media such as a CD, DVD, floppy disk, etc. In the present embodiment In the present embodiment a software program, operable on the computer receives the first set of critical dimension error measurements (from step 702), receives the second set of critical dimension error measurements (from step 704), receives a set of overlay error measurements that indicate the overlay error between the first patterned layer and the second patterned layer (from step 705), receives a line edge placement specification, and is operable to determine whether the lot of semiconductor wafers should be reworked. In one embodiment the computer is operable to determine dynamic line edge placement tolerance using equations 11-12 and 15. The computer indicates that the lot should be reworked when the calculated dynamic line edge placement value exceeds the line edge placement specification.

By dynamically determining line edge placement tolerance, method 700 of the present invention expands the range of overlay error that can be tolerated. Accordingly, method 700 avoids unnecessary rework of lots of wafers while maintaining product yield. For example, any of the following combinations of mean overlay error and overlay variability would meet a line edge placement specification of 90 nanometers using method 700 of the present invention and assuming a common assumed critical dimension error (mean+3σ):

| Mean Overlay Error (nm) | Overlay Variability 3σ (nm) | Overlay \|mean\| + 3σ (nm) |
|---|---|---|
| 0 | 68 | 68 |
| 10 | 57 | 67 |
| 20 | 44 | 64 |
| 30 | 29 | 59 |
| 40 | 10 | 50 |

Figure 8:
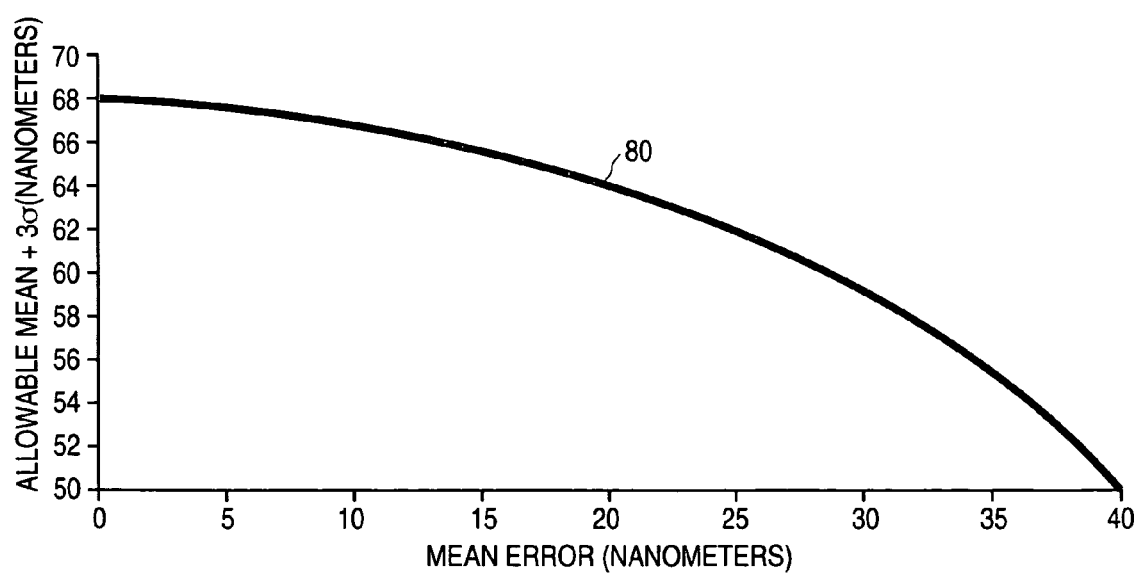
FIG. 8 is a graph that illustrates the relationship between mean overlay error determined in accordance with method 700 of FIG. 7 and the corresponding allowable overlay error (mean +3σ) in for a line edge placement specification of 90 nanometers in accordance with one embodiment of the present invention.

Referring now to FIG. 8, the relationship shown in the above chart is illustrated. More particularly, line 80 indicates the relationship between mean overlay error (e.g., a mean error determined in accordance with equation 7) and the corresponding allowable overlay error (mean+3σ) in the lot for a line edge placement specification of 90 nanometers. It can be seen that method 700 provides for lots with low mean overlay error to pass (step 709), even when those lots have a relatively high overlay error (mean+3σ). Moreover, in the example illustrated in FIG. 8 it can be seen that lots having a mean overlay error of as much as 68 nanometers will pass. This can be compared to a typical prior art decoupled approach in which only lots having overlay error (mean+3σ) of 35 nanometers or less will pass.

Figure 9:
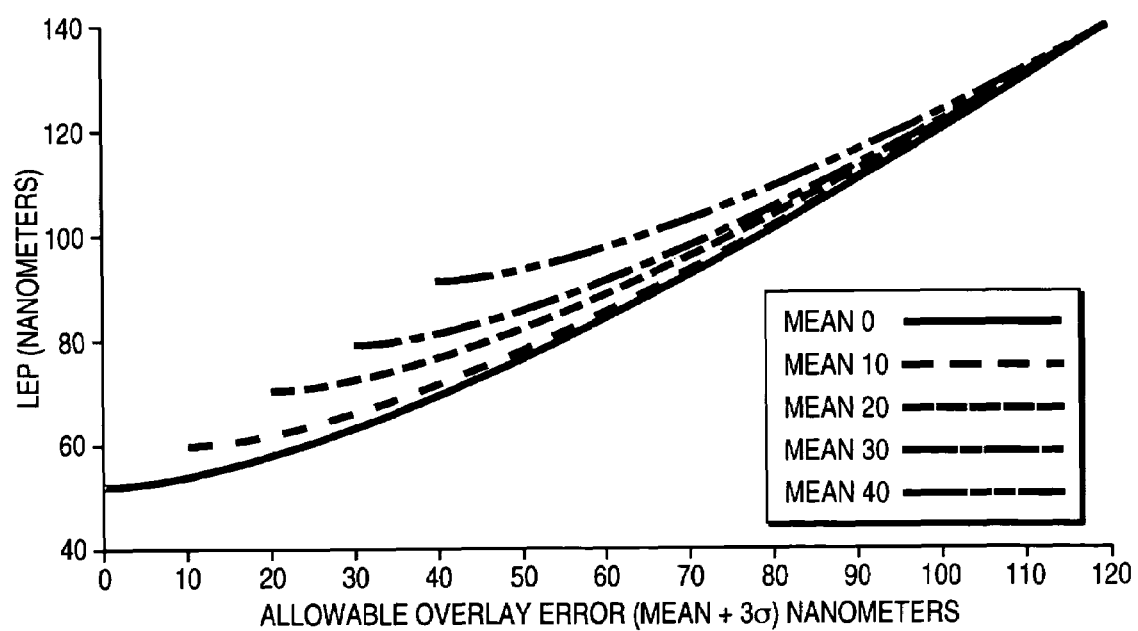
FIG. 9 is a graph that illustrates exemplary line edge placement specifications (LEP) on the vertical axis in nanometers and illustrates allowable overlay error (mean +3σ) in nanometers on the horizontal axis for mean overlay error determined in accordance with method 700 of FIG. 7 of 0, 10, 20, 30 and 40 nanometers in accordance with one embodiment of the present invention.

Method 700 provides for dispositioning of semiconductor wafers based upon an interactive coupling of the mean error and the within lot error distribution. Thus the mean of the measured distribution serves to establish the limit on the overall \|mean\|+3σ allowed for the lot in question. The benefit of such a methodology is to avoid unnecessary rework of lots whose mean overlay error may be very close to zero, and can therefore tolerate a larger \|mean\|+3σ metric than could other lots with significant mean errors. This will become more and more critical/beneficial as line edge placement specifications become lower with increased technology generations. This can be seen in FIG. 9 where the impact to LEP is compared for variable mean error components. For LEP specifications above 120 nm, (180 nm technology node and above) there is little benefit to the present approach. However, for LEP specifications below 120 nanometers the methods of the present invention will give superior results as compared to prior art methods. At the 90 nanometer technology node, where it is generally accepted that overlay budgets will be approximately 35 nanometers, the impact of mean errors is seen to be quite significant. Accordingly, as geometries decrease toward the 90 nanometer technology node and below, the relative benefits of the methods of the present invention will continue to increase.

The preferred embodiment of the present invention is thus described. While the present invention has been described in particular embodiments, it should be appreciated that the present invention should not be construed as limited by such embodiments, but rather construed according to the following claims.

The invention claimed is:

1. A method for determining overlay tolerance for a lot of semiconductor wafers comprising:
   measuring a first patterned layer on some of said semiconductor wafers so as to obtain a first set of critical dimension error measurements;
   measuring a second patterned layer on some of semiconductor wafers so as to obtain a second set of critical dimension error measurements; and
   determining overlay tolerance for said lot of semiconductor wafers using said first set of critical dimension error measurements, said second set of critical dimension error measurements and a line edge placement specification for said lot of semiconductor wafers.

2. The method of claim 1 wherein said measuring a first patterned layer further comprises:
   selecting from said lot of semiconductor wafers a first set of sample wafers; and
   measuring critical dimension error at a plurality of locations on each semiconductor wafer in said first set of sample wafers.

3. The method of claim 2 wherein said measuring a second patterned layer further comprises:
   selecting from said lot of semiconductor wafers a second set of sample wafers; and
   measuring critical dimension error at a plurality of locations on each semiconductor wafer in said second set of sample wafers.

4. The method of claim 1 wherein said determining overlay tolerance for said lot of semiconductor wafers further comprises:
   determining overlay tolerance for said lot of semiconductor wafers using variance of said first set of critical dimension error measurements ($VCD_A$), mean error of said first set of critical dimension error measurements ($dCD_A$), variance of said second set of critical dimension error measurements ($VCD_B$), mean error of said second set of critical dimension error measurements ($dCD_B$), and said line edge placement specification (SPEC).

5. The method of claim 4 wherein said overlay tolerance for said lot of semiconductor wafers is determined according to the following equation:

$$OT = \sqrt{(SPEC_{-dCD_A-dCD_B})^2 - \left(\frac{VCD_A}{2}\right)^2 - \left(\frac{VCD_B}{2}\right)^2}.$$

6. The method of claim 1 wherein said overlay tolerance for said lot of semiconductor wafers is determined using a graph.

7. A method for determining whether a lot of semiconductor wafers should be reworked comprising:
    measuring a first patterned layer on some of said semiconductor wafers so as to obtain a first set of critical dimension error measurements;
    measuring a second patterned layer on some of said semiconductor wafers so as to obtain a second set of critical dimension error measurements;
    measuring overlay error between said first patterned layer and said second patterned layer on some of said semiconductor wafers; and
    reworking said lot of semiconductor wafers when said measured overlay error exceeds an overlay tolerance determined using said first set of critical dimension error measurements, said second set of critical dimension error measurements, and a line edge placement specification.

8. The method of claim 7 wherein said overlay tolerance is determined using variance of said first set of critical dimension error measurements ($VCD_A$), mean of said first set of critical dimension error measurements ($dCD_A$), variance of said second set of critical dimension error measurements ($VCD_B$), mean of said second set of critical dimension error measurements ($dCD_B$), and said line edge placement specification (SPEC).

9. The method of claim 8 wherein said overlay tolerance is determined according to the following equation:

$$OT = \sqrt{(SPEC_{-dCD_A-dCD_B})^2 - \left(\frac{VCD_A}{2}\right)^2 - \left(\frac{VCD_B}{2}\right)^2}.$$

10. A computer-implemented method for determining overlay tolerance comprising:
    receiving a first set of critical dimension error measurements, said first set of critical dimension error measurements indicating critical dimension error of a first patterned layer formed on a plurality of semiconductor wafers;
    receiving a second set of critical dimension error measurements, said second set of critical dimension error measurements indicating critical dimension error of a second patterned layer formed on said semiconductor wafers;
    receiving a line edge placement specification for said semiconductor wafers; and
    calculating overlay tolerance using said first set of critical dimension error measurements, said second set of critical dimension error measurements, and a line edge placement specification for said semiconductor wafers.

11. The computer-implemented method of claim 10 wherein said calculating overlay tolerance further comprises:
    calculating overlay tolerance (OT) using variance of said first set of critical dimension error measurements ($VCD_A$), mean of said first set of critical dimension error measurements ($dCD_A$), variance of said second set of critical dimension error measurements ($VCD_B$), mean of said second set of critical dimension error measurements ($dCD_B$), and said line edge placement specification (SPEC).

12. The computer-implemented method of claim 11 wherein said overlay tolerance is determined according to the following equation:

$$OT = \sqrt{(SPEC_{-dCD_A-dCD_B})^2 - \left(\frac{VCD_A}{2}\right)^2 - \left(\frac{VCD_B}{2}\right)^2}.$$

13. A method for determining critical dimension tolerance for a lot of semiconductor wafers comprising:
    measuring overlay error between a first patterned layer and a second patterned layer on some of said semiconductor wafers so as to obtain a first set of overlay error measurements; and
    determining critical dimension tolerance for said lot of semiconductor wafers using said overlay error measurements and using a line edge placement specification for said semiconductor wafers.

14. The method of claim 13 wherein said critical dimension tolerance is determined using mean error of said overlay error measurements ($dO_{B-A}$), variance of said overlay error measurements ($VO_{B-A}$) and said line edge placement specification (SPEC).

15. The method of claim 14 wherein said critical dimension tolerance (CDT) is determined according to the following equation:

$$CDT = \sqrt{(SPEC_{-dO_{B-A}})^2 - \left(\frac{VO_{B-A}}{2}\right)^2}.$$

16. A method for determining whether a lot of semiconductor wafers should be reworked comprising:
    measuring overlay error between a first patterned layer and a second patterned layer on some of said semiconductor wafers so as to obtain a plurality of overlay error measurements;
    measuring critical dimension error of said second patterned layer on some of said semiconductor wafers; and
    reworking said lot of semiconductor wafers when said measured critical dimension error exceeds a critical dimension tolerance determined using said overlay error measurements and a line edge placement specification.

17. The method of claim 16 wherein said critical dimension tolerance is determined using variance of said overlay error measurements ($VO_{B-A}$), mean of said overlay error measurements ($dO_{B-A}$) and said line edge placement specification (SPEC).

18. The method of claim 17 wherein said critical dimension tolerance (CDT) is determined according to the following equation:

$$CDT = \sqrt{(SPEC_{-dO_{B-A}})^2 - \left(\frac{VO_{B-A}}{2}\right)^2}.$$

19. A computer-implemented method for determining critical dimension tolerance for a lot of semiconductor wafers comprising:
    receiving a plurality of overlay error measurements, said overlay error measurements indicating overlay error between a first patterned layer and a second patterned layer on some of said semiconductor wafers;
    receiving a line edge placement specification for said semiconductor wafers; and calculating critical dimension tolerance for said lot of semiconductor wafers using said overlay error measurements and using said line edge placement specification.

20. The computer-implemented method of claim 19 wherein said critical dimension tolerance (CDT) is calculated using variance of said overlay error measurements ($VO_{B-A}$), mean of said overlay error measurements ($dO_{B-A}$) and said line edge placement specification (SPEC).

21. The computer-implemented method of claim 20 wherein said critical dimension tolerance is calculated according to the following equation:

$$CDT = \sqrt{(SPEC_{-dO_{B-A}})^2 - \left(\frac{VO_{B-A}}{2}\right)^2}.$$

22. A method for determining an estimate of line edge placement error for a lot of semiconductor wafers comprising:
   measuring a first patterned layer on some of said semiconductor wafers so as to obtain a first set of critical dimension error measurements;
   measuring a second patterned layer on some of said semiconductor wafers so as to obtain a second set of critical dimension error measurements;
   measuring some of said semiconductor wafers so as to obtain a set of overlay error measurements; and
   determining an estimate of line edge placement error for said lot of semiconductor wafers using said first set of critical dimension error measurements, said second set of critical dimension error measurements, and said set of overlay error measurements.

23. The method of claim 22 wherein said determining an estimate of line edge placement error further comprises:
   determining an estimate of line edge placement error using variance of said first set of critical dimension error measurements ($VCD_A$), mean of said first set of critical dimension error measurements ($dCD_A$), variance of said second set of critical dimension error measurements ($VCD_B$), mean of said second set of critical dimension error measurements ($dCD_B$), variance of said set of overlay error measurements (VO), and mean of said set of overlay error measurements (dO).

24. The method of claim 23 wherein said estimate of line edge placement error is a mean+3σ estimate.

25. The method of claim 24 wherein said estimate of line edge placement error (D) is determined according to the following equation:

$$D = dO + \left(\frac{dCD_A}{2}\right) + \left(\frac{dCD_B}{2}\right) + \sqrt{\left(\frac{VCD_A}{2}\right)^2 + \left(\frac{VCD_B}{2}\right)^2 + VO^2}.$$

26. The method of claim 25 wherein said estimate of line edge placement error is a single number that indicates the error state of said lot of semiconductor wafers.

27. A method for determining whether a lot of semiconductor wafers should be reworked comprising:
   measuring a first patterned layer on some of said semiconductor wafers so as to obtain a first set of critical dimension error measurements;
   measuring a second patterned layer on some of said semiconductor wafers so as to obtain a second set of critical dimension error measurements;
   measuring some of said semiconductor wafers so as to obtain a set of overlay error measurements that indicate the overlay error between said first patterned layer and said second patterned layer;
   determining an estimate of line edge placement error for said lot of semiconductor wafers using said first set of critical dimension error measurements, said second set of critical dimension error measurements, and said set of overlay error measurements; and
   reworking said lot of semiconductor wafers when said estimate of line edge placement error exceeds a line edge placement specification.

28. The method of claim 27 wherein said estimate of line edge placement error is determined using variance of said first set of critical dimension error measurements ($VCD_A$), mean of said first set of critical dimension error measurements ($dCD_A$), variance of said second set of critical dimension error measurements ($VCD_B$), mean of said second set of critical dimension error measurements ($dCD_B$), variance of said set of overlay error measurements (VO), and mean of said set of overlay error measurements (dO).

29. The method of claim 28 wherein said estimate of line edge placement error is a mean+3σ estimate and wherein said line edge placement specification is a mean+3σ specification.

30. The method of claim 29 wherein said estimate of line edge placement error (D) is determined according to the following equation:

$$D = dO + \left(\frac{dCD_A}{2}\right) + \left(\frac{dCD_B}{2}\right) + \sqrt{\left(\frac{VCD_A}{2}\right)^2 + \left(\frac{VCD_B}{2}\right)^2 + VO^2}.$$

31. A computer-implemented method for determining whether a lot of semiconductor wafers needs to be reworked comprising:
   receiving a first set of critical dimension error measurements, said first set of critical dimension error measurements indicating critical dimension error of a first patterned layer for some of said semiconductor wafers;
   receiving a second set of critical dimension error measurements, said second set of critical dimension error measurements indicating critical dimension error of a second patterned layer for some of said semiconductor wafers;
   receiving a set of overlay error measurements, said set of overlay error measurements indicating overlay error between said first patterned layer and said second patterned layer on some of said semiconductor wafers; and
   calculating an estimate of line edge placement error using said first set of critical dimension error measurements, said second set of critical dimension error measurements, and said set of overlay error measurements.

32. The computer-implemented method of claim 31 further comprising:
   receiving a line edge placement specification for said semiconductor wafers; and
   indicating that said semiconductors should be reworked when said estimate of line edge placement error exceeds said line edge placement specification.

* * * * *